(12) United States Patent  
Ruohonen

(10) Patent No.: US 7,257,177 B2  
(45) Date of Patent: Aug. 14, 2007

(54) DETERMINATION OF A REFERENCE VALUE FOR AUTOMATIC GAIN CONTROL OF A RECEIVER COMMUNICATING WITH A PACKET SWITCHED COMMUNICATION NETWORK

(75) Inventor: Jari Ruohonen, Tampere (FI)

(73) Assignee: Nokia Corporation, Espoo (FI)

( * ) Notice: Subject to any disclaimer, the term of this patent is extended or adjusted under 35 U.S.C. 154(b) by 625 days.

(21) Appl. No.: 10/091,263

(22) Filed: Mar. 4, 2002

(65) Prior Publication Data

US 2002/0163980 A1    Nov. 7, 2002

(30) Foreign Application Priority Data

Mar. 5, 2001    (FI) .................................. 20010439

(51) Int. Cl.  
*H04L 27/08* (2006.01)

(52) U.S. Cl. .................................................... 375/345

(58) Field of Classification Search ............... 375/317, 375/345; 455/232.1, 245.1, 240.1, 250.1  
See application file for complete search history.

(56) References Cited

U.S. PATENT DOCUMENTS 5,331,638 A * 7/1994 Honkasalo et al. ......... 370/347  
5,758,271 A * 5/1998 Rich et al. ................ 455/234.1  
6,012,031 A * 1/2000 Oliver et al. ............... 704/500  
6,502,063 B1 * 12/2002 Eriksson et al. ............ 702/190  
6,603,825 B1 * 8/2003 Pecen ......................... 375/345

FOREIGN PATENT DOCUMENTS

| EP | 0725479 A1 | 8/1996 |
| EP | 1061643 A | 12/2000 |
| GB | 2346748 A | 8/2000 |
| WO | 9805844 A | 2/1998 |
| WO | WO 99/34506 | 7/1999 |

OTHER PUBLICATIONS

ETSI Technical Specification 100911, Digital Cellular Telecommunications System (Phase 2+); Radio subsystem link control (3GPP TS 05.08 version 8.6.0 , 1999.

* cited by examiner

*Primary Examiner*—Khanh Tran  
(74) *Attorney, Agent, or Firm*—Perman & Green, LLP

(57) ABSTRACT

A device and a method for determining a reference level for automatic gain control of a radio frequency signal to be received, particularly having a varying strength, in which method radio blocks are received on a logical general packet data traffic channel of a signal, which radio blocks have been transmitted with a predetermined transmission power level and by using a predetermined way of controlling the transmission power level. In the invention, said reference level is continuously determined on the basis of correctly received or valid radio blocks, wherein the reference level is corrected on the basis of the signal strength measured during the reception of each valid radio block.

38 Claims, 2 Drawing Sheets

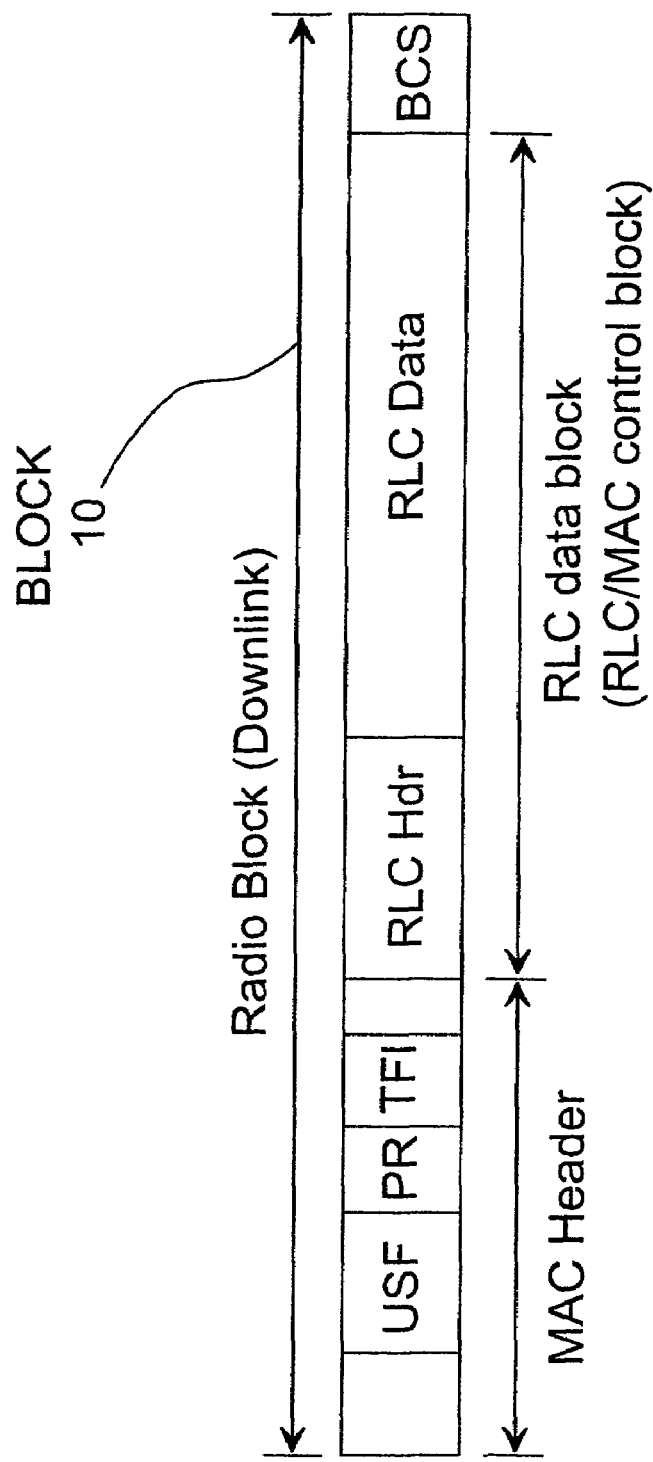

DETERMINATION OF A REFERENCE VALUE FOR AUTOMATIC GAIN CONTROL OF A RECEIVER COMMUNICATING WITH A PACKET SWITCHED COMMUNICATION NETWORK

TECHNICAL FIELD

The present invention relates to a method for determining a reference level for automatic gain control of a radio frequency signal to be received, particularly having a varying strength. The invention relates to a device for determining a reference level for automatic gain control of a radio frequency signal to be received, particularly having a varying strength.

BACKGROUND ART

A wireless communication system generally refers to a communication system which makes a wireless data transmission connection possible between a wireless communication device (MS, mobile station) and stationary parts of the system, the user of the wireless communication device moving within the operating range of the system. A typical system is a public land mobile network PLMN. A majority of wireless communication systems belongs to so-called second-generation mobile communication systems, of which an example to be mentioned is the widely known circuit switched GSM mobile communication system (Global System for Mobile Telecommunications). The present invention is particularly suitable for mobile communication systems under development. As an example of such a communication system, in this description, the GPRS system (General Packet Radio Service) will be used, which is presently under development. It is obvious that the invention can also be applied in other systems which are based on packet systems, such as the GPRS system, or which utilize it (UMTS, Universal Mobile Telecommunication System).

In modern general mobile communication networks based on a cellular system, the system consists, in a known way, of several mobile stations (MS) applying the system, such as mobile phones, and a stationary base station subsystem (BSS). This base station subsystem normally consists of several base transceiver stations (BTS) distributed over a geographical area, and each base station serves a cell which consists of at least a part of this geographical area.

For example, in the GSM system, communication between communication devices, such as a mobile station and a base station, is carried on logical radio channels. A packet switched system based on the GSM system, the GSM GPRS system, makes communication more efficient, since the same logical radio channel can be used by several different mobile subscribers. Data is transmitted only when necessary, and the logical radio channel is not allocated to communication between one mobile station and one base station only. In the system, there is a so-called virtual data transmission connection between the mobile station and the GPRS system. The operating environment of the system is known as such and is widely defined in the ETSI standards, wherein a more detailed description will not be necessary. For using GPRS services, the MS will first log in the network (GPRS attach). The login forms a logical link between the wireless communication device and the serving GPRS support node SGSN.

The trouble-proof operation of the communication network and the efficient utilization of the available resources are only possible, if the power levels used in the transmissions by e.g. the base stations are as optimal as possible. In addition to this, demands are continuously set for the power consumption of the mobile station itself.

The basic idea of the GPRS system is to apply packet switched resource allocation, wherein resources, e.g. a logical radio channel, are allocated when there is a need to transmit and receive data and information. Thus, the use of available resources can be optimized to be as efficient as possible when compared with e.g. circuit switched GSM technology. The GPRS is designed to support applications which utilize discontinuous data transmission containing, intermittently, even large quantities of data. In the GPRS system, the allocation of channels is flexible, and 1 to 8 time slots of a channel, i.e. 1 to 8 physical channels, can be allocated to each wireless communication device within the scope of a TDMA frame. The term TDMA (Time Division Multiple Access) refers to the division of a radio frequency channel into successive time slots on the time level, known as such. The same resources can be allocated to several active mobile stations. U communication (uplink, i.e. communication from the mobile station to the base station) and D communication (downlink, i.e. communication from the base station to the mobile station) can be separately allocated to different users. In each time slot, an information packet with a definite duration is transmitted as a radio frequency burst consisting of a set of modulated bits. The time slots are primarily used as control channels (CCH) and traffic channels (TCH). The traffic channels are primarily used for the transmission of speech and data, and the control channels are used for signalling between the BTS and the MS. One logical control channel is the BCCH (Broadcast Control Channel), which is used for broadcasting detailed information related to the communication network or the cell. This information relates, for example, to the frequencies used by the cell in question and by the adjacent cell, as well as to the surrounding cells, frequency hopping, channel combinations, and paging groups.

The most significant difference between the GPRS system and the circuit switched GSM system is the packet-based communication. A physical channel, so-called packet data channel PDCH, is allocated to packet communication in the GPRS system based on a cellular system. The logical channels contained in the PDCH channel (e.g. PDTCH/D, Downlink Packet Data Traffic Channel) are collected into a frame structure (Multiframe) consisting of repeatedly transmitted 52 TDMA frames (20) which are divided (PCDH/F, Full rate PDCH channel) further into 12 successive blocks (radio blocks), each comprising four frames (TDMA FRAME) as well as four extra frames (IDLE FRAME). The blocks 10 are indicated by blocks B0 to B11, respectively, as shown in FIG. 1. In FIG. 1, the idle frames are also indicated with the reference X. In D communication, these can be used for signalling.

The blocks 10 are further divided into the following parts shown in FIG. 2: MAC header (Medium Access Control Header), RLC data block (Radio Link Control Data Block) or RLC/MAC control block, and BCS block (Block Check Sequence). The RLC data block contains an RLC header and RLC data. The MAC header also comprises a USF field (Uplink State Flag). The terms LLC, RLC and MAC refer to different levels (protocol layers) in a protocol structure according to an OSI model (Open Structured Interface), known as such, which are described in more detail in the ETSI standard specifications.

For multiple access in D communication, a temporary flow identifier TFI is used in the data header. Each RLC header contains a TFI which is used to indicate the blocks addressed to a specific, given mobile station MS. According to the GPRS system, all the communication devices MS, which are waiting for data transmitted to them on the channel jointly allocated to them, receive all the blocks, including the RLC blocks, interpret the received information and the TFI, and select the blocks addressed to them.

During channel allocation, at the beginning of the data transmission, the MS is informed of the allocated blocks, during which transmission and reception is possible. The connection is set up either by means of a packet channel request PCR, which is transmitted by the mobile station to request for resources from the base transceiver station on the packet random access channel PRACH, or by means of a packet paging request PPR transmitted by the base transceiver station. The resources allocated for data transmission are indicated, for example, by means of a packet uplink assignment PUA or a packet downlink assignment PDA, containing e.g. a list of the available PDCH channels, the value of the USF field to be used, and a determined individual temporary flow indicator TFI which is added to each RLC block used in the communication. In the GPRS system, the mobile stations must be continuously ready for packet communication (Temporary Block Flow, TBF), wherein they must quickly shift from the so-called idle mode to the so-called packet transfer mode.

In digital TDMA systems, such as the GSM system, the mobile communication device continuously measures the signal strength on radio channels of the serving base station and the adjacent base stations, and transmits a measuring report to the base station. The measurements taken by the mobile communication device are typically, and in a way known as such, related to power control used in D communication, cell reselection or handover. Power control refers, for example, to the transmission power level used by the BTS for transmitting a radio signal to the MS.

In a way known as such, the MS maintains information about the received signal strength of the used BCCH radio channel by means of an average. This information and the calculated C parameter (normalized Rx level) are utilized in decisions related to cell reselection. The signal strength is measured in units of dBm. The averaging is based on at least five, normally six samples taken from the radio channel during one multiframe structure (52 TDMA frames). The rules for power control, the measurement, the calculation of the C value, and the modes A and B for the power control, which will be described in the following, are also defined in more detail for example in the ETSI specification (European Telecommunications Standards Institute) 3GPP TS 05.08 V8.6.0 (2000-09), particularly in the chapter: 10.2. RF Power Control, which is incorporated herein as a reference. The present invention for calculating the ARR parameter utilizes these same samples $SS_n$ of the received signal level, Rx level.

One known technology used in mobile stations for controlling the gain of the receiver is the so-called AGC method (Automatic Gain Control), which has the function of tracing the effects caused by the mobility and the environment of the MS, for example, on the radio wave in connection with multipath propagation. These include, for example, reflections, frequency dependent drop-outs and attenuations, as well as various slow and fast changes. The signal levels are also changed as a result of BTS power control in D communication. In the invention, in turn, the operation of the AGC is based on tracing the Rx levels of the received signal, when the MS is receiving on the PDTCH channel. Both the PDTCH and the BCCH channels are traced. The MS must be capable of tracing changes in the received downlink signal in order to be able to interpret the information of the block, for example the TFI data, so that the MS can determine whether the block is addressed to it for reception. The aim is to set the gain level of the received analog RF signal before the AD (analog-to-digital) conversion and on a reference level suitable for input in the receiver of the MS. The dynamic range of the receiver is typically defined to be restricted above (15 dB) and below (20 dB) a specific reference level. The difference in the power levels between the frames can be as great as 30 dB.

According to the rules of the ETSI/3GPP specification in the GPRS system, constant power control is used for D communication on PDCH channels, which are used, for example, as PBCCH and PCCCH control channels. The power level can be lower on the PCCCH than on the BCCH channel (Broadcast Control Channel), the difference (Pb) being indicated on the PBCCH channel. The PTCCH/D channel (Packet Transfer Control Channel) applies the same power level as the PBCCH channel, or if this is missing, the same power level as the BCCH channel. Thus, different frequencies must be allocated for the PCCCH and for the BCCH, because the BCCH frequency always has a constant power level. In the blocks of the other PCDH channels, it is possible to use power control in D communication. The power level is always the same during the bursts (4 bursts) of a single radio block.

In a known manner, two different control modes are used for the power control of the PDCH blocks: Mode A, and Mode B when fixed allocation is used only. In Mode A, the variation in the output power of the BTS is limited, whereas in Mode B, the whole range of variation of the output power of the BTS is in use. The used mode is indicated to the MS in connection with resource allocation (so-called Assignment message). In both modes, the so-called P0 parameter is used, which indicates the power reduction compared to the BCCH channel whose carrier can be continuously traced. The parameter P0 is also indicated in the Assignment message. The used mode and the value of P0 are not changed without new assignment messages when the MS is in packet transfer mode.

Each block of the PDTCH/D channel contains a PR field in the MAC header, to indicate the power level of said block, if it is in use and power control is used. There are two PR modes. In PR mode A (appended Table 1), the PR value is calculated on the basis of the output power level used by the BTS, when the block is addressed to a specific receiving MS. A P0 value is determined for each MS.

The PR value is calculated in relation to the P0 value of the MS in question. In PR mode B (appended Table 2), the same power level is used for each block and for each mobile station on the same PDCH channel communicating (TBF) with the BTS. The P0 value indicates the power level of the first block on the PDCH, and the PR value is calculated in relation to the level of the BCCH.

TABLE 1

| Bits | Power reduction, Mode A |
| --- | --- |
| 0 0 | 0 to 2 dB lower than BCCH level - P0 |
| 0 1 | 4 to 6 dB lower than BCCH level - P0 |
| 1 0 | 8 to 10 dB lower than BCCH level - P0 |
| 1 1 | Not usable |

TABLE 2

| Bits | Power reduction, PR Mode B |
| --- | --- |
| 0 0 | 0 to 6 dB lower than BCCH level |
| 0 1 | 8 to 14 dB lower than BCCH level |
| 1 0 | 16 to 22 dB lower than BCCH level |
| 1 1 | 24 to 30 dB lower than BCCH level |

According to the GPRS specifications, the BTS transmits to the mobile stations in packet transfer mode at least one reference block, which conforms to the used mode, at certain intervals (78 TDMA frames). The reference block is also transmitted when the power control is not in use. In addition to this, if power control is used, in PR Mode A and PR Mode B, the reference block contains a usable PR field. In PR Mode A, valid, usable blocks only include blocks addressed to the MS in question and having a valid PR value, but in PR Mode B, the block does not need to be addressed to the MS in question.

For PDTCH configuration, i.e., in a situation in which the MS is in GPRS packet transfer mode, no procedure is defined in prior art, for determining the reference value for the AGC function. It is an aim of the present invention to present this method.

DISCLOSURE OF INVENTION

In the method according to the invention, a reference value is continuously determined, which will, in this description, be referred to as the parameter AGC_REF_RX-LEX (ARR-parameter), which thus describes the power level, Rx level, of the received signal. On the basis of the ARR parameter, it is possible to calculate new values for the gain in the AGC.

Consequently, when power control is in use, blocks addressed to the MS in question must be traced in PR Mode A (the blocks also including a PR field to indicate a predetermined power level), because the power levels of other blocks do not give the right picture of the variations (valid reference block). In PR Mode B, in turn, it is possible to trace all the received blocks (which contain a PR field) which can be addressed to anybody (valid reference block), because the power level is the same. When power control is not in use, it is not necessary to restrict to the tracing of the PR fields or to the tracing of blocks addressed (TFI) to the MS in question only, because all the blocks (valid reference block) are transmitted at the same predetermined power level. Consequently, the procedure according to the invention is thus suitable for different modes and also for the case in which power control is not in use.

The invention is based on facts to be presented in the following. Depending on the control mode of D communication, the Rx level of those blocks will be calculated, which can be used as valid AGC reference blocks according to the invention. This applies also to a situation in which no power control is used. When the BTS uses power control, the valid blocks are determined on the basis of the PR fields (and, if necessary, also the TFI fields) of the block. All the blocks which have been correctly (flawlessly CRC checking passes) received can be used as valid reference blocks, when D power control is not used by the BTS. By using all the possible valid reference blocks of the PDTCH carrier (Packet Data Traffic Channel), a more reliable estimate is received of the RSSI level (Received Signal Strength Indicator) of the carrier, which is further used for estimating the correct gain. Alternatively, it would be possible to use, for example, only the BCCH channel for estimating the Rx level of the PDTCH channel, but an error would be caused in the estimate, due to frequency selective fading.

In the GPRS system, however, it is not known beforehand, how often the MS really receives valid reference blocks. According to the invention, the values of the Rx levels of these received blocks are averaged (within time), particularly by using a filter with a variable length. Thus, the period of time used for averaging remains substantially constant. A filter with a variable length makes it possible to do a quick adaptation to the correct channel RSSI level in situations in which the number and interval of received reference blocks are not known beforehand and in which the RSSI level varies quickly.

During PDTCH communication, also the carrier level of the BCCH channel of the serving BTS is traced. The carrier is traced at determined intervals, and the samples are averaged with respect to time. If the MS does not, for any reason, receive valid reference blocks within a set time (particularly 78 TDMA frames), the BCCH carrier level is used as a help to estimate the PDTCH carrier level for the AGC. The use of the BCCH channel as an auxiliary reference supports the function of the AGC particularly in situations, in which the MS, for any reason, cannot correctly decode the blocks transmitted by the BTS (so-called CRC check-up) and, therefore, does not receive sufficiently valid reference blocks.

In the known circuit switched GSM system, in turn, the AGC of traffic channels (TCH) has been possible with simpler algorithms, because there is always communication on e.g. the SACCH channel (Slow Associated Control Channel) and in the SID frame (Silence Indicator) and, on the basis of the frame number, the MS knows better their moment of time, wherein the Rx level of the bursts of these frames can be used for implementing the AGC algorithm. When a traffic channel is allocated for an MS, also an SACCH channel is always related to it, for the transmission of information relating to the maintenance of the channel and the data transmission connection. The averaging of Rx levels of bursts in relation to time is used, but there has not been a need for a varying filter length, because the number of received reference bursts within the period of time has been constant. Instead, there are no known solutions for the calculation of reference values of GPRS traffic channels (PDTCH) for the AGC.

BRIEF DESCRIPTION OF DRAWINGS

The invention will be described with reference to the appended drawings, in which:

FIG. 2 shows a block structure of prior art, particularly the structure of a radio block in the GPRS system.

MODES FOR CARRYING OUT THE INVENTION

Figure 1:
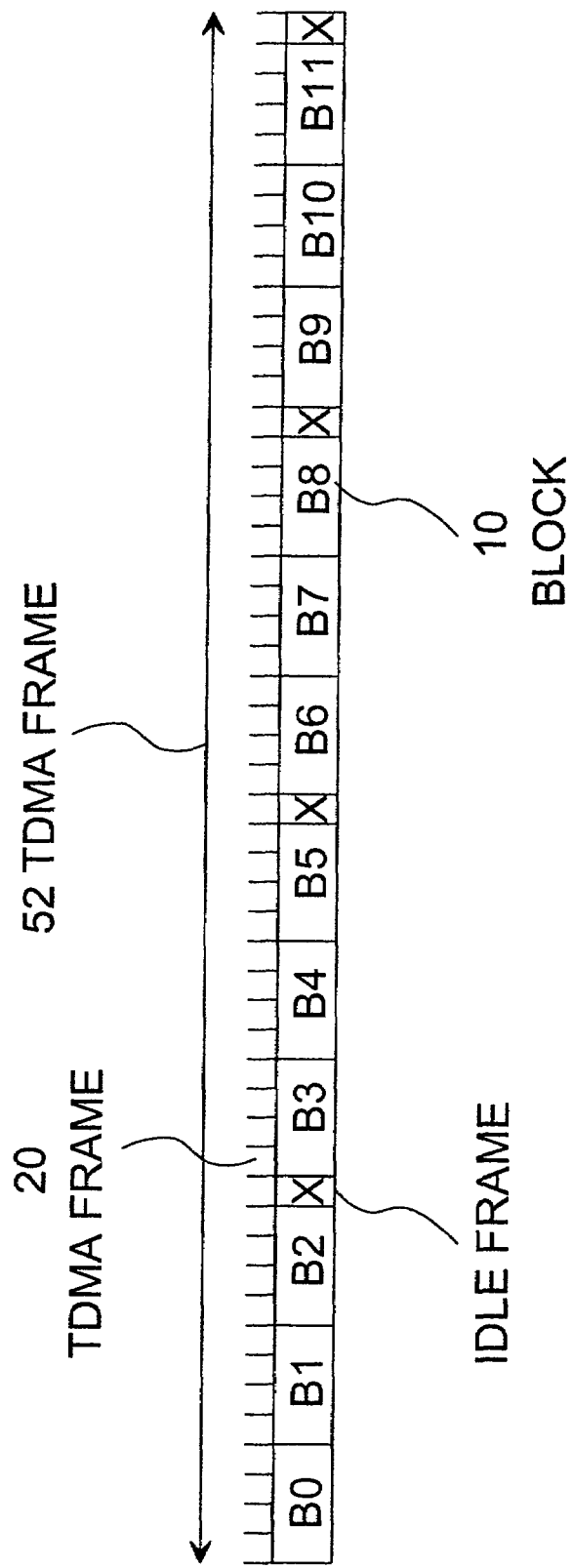
FIG. 1 shows a frame structure of prior art, particularly the frame structure of the GPRS system.

We shall next discuss the tracing of the Rx level of the BCCH channel, which is performed in both modes of the power control (Modes A and B). The Rx level is traced for determining the reference Rx level for the AGC. The BCCH channel of the serving base station is traced with a running average, which complies with formula (1):

$$BCCH\_RA\_n = (1-a)*(BCCH\_RA\_n-1) + a*NEW\_BCCH\_SAMPLE, \quad (1)$$

in which the BCCH_RA_n is the running average of the Rx level of the BCCH after n samples, a is calculated by the formula 1/MIN(n, BCCH_RA_FILT_LEN), in which MIN refers to the smallest alternative, and NEW_BCCH_SAMPLE is a sample of the Rx level of the BCCH. The samples used are the same as, for example, in the calculation of the C value. A difference is, however, the so-called forgetting factor in the calculation, that is, 1/BCCH_RA_FILT_LEN, which can now be freely selected. In the calculation of the C value, the factor is set by the network. The calculation of BCCH_RA_n is started/initialized, when the MS starts to prepare the beginning of data transmission and is transferred from the DRX state to the non-DRX state, and is maintained as long as the MS is in the non-DRX state.

We shall next discuss the tracing of the Rx level in the power control of Mode A, wherein the aim is to determine the ARR parameter which corresponds to the transmission power level of the BTS on the level BCCH-P0. The network must transmit a reference block at certain intervals (at least once within a sequence of 78 TDMA frames). Normally, when the MS receives blocks whose Rx level can be used for the AGC according to the rules of D power control, the ARR parameter is calculated by using the running average of the Rx levels of the blocks in question. The BTS transmission power of the blocks is known by means of the PR field, and the measured Rx levels of the reference blocks can be mapped to correspond to the transmission power on the level BCCH-P0. The length, in time, of the sequence of calculating the average is kept substantially constant by changing the filter length of the calculation of the average, which is dependent on the frequency of occurrence of AGC reference blocks which is, for example, 78 TDMA frames. If the MS does not, for any reason, receive reference blocks during 78 TDMA frames, the ARR parameter value is adapted to the level BCCH_RA_n-P0.

In the following, we describe the algorithm of Mode A in more detail.

In the algorithm according to the invention, the reference Rx level intended for the AGC is traced in the PDTCH configuration, that is, when the MS is in the GPRS transfer state. The gain is calculated for the next beginning block period (78 frames), after AGC_REF_RXLEV has first been updated by using the algorithm. In PR Mode A, all the correctly received RLC blocks addressed to the MS and having a valid PR field can be used as reference blocks. In PR Mode B, all the correctly received RLC blocks having a valid PR field can be used as reference blocks. At the beginning of the PDTCH configuration, the value AGC_REF_RXLEV is set to the value BCCH_RA_n-P0.

The constant REF_RXLEV_FILT_LEN_A used in the algorithm is the filter length for the calculation of the running average in Mode A. AGC_UPDATE_INTERVAL is an interval in blocks, indicating how often AGC_REF_RXLEV must be updated, if MS has not received blocks addressed to it. At present, the interval is 78 TDMA frames, or 18 radio blocks. X and Y are constants for weighting the level BCCH_RA_n in the estimation of the Rx level, when no valid reference blocks have been received. The variable BLOCKS_RXLEVS_A used in the algorithm is the measured average of the Rx level of the reference blocks in units of dBm and during the preceding block period as well as compensated on the basis of data on the PR field, to correspond to the level BCCH-P0. The Rx level of the block is compensated for by adding to it 1, 5 or 9 dB, depending on the value of the PR field (00, 01, 10). The variable has a valid value only when the MS has received reference blocks during the preceding block period. MAX_BLK_RXLEV is the maximum Rx level of the block after the latest valid reference block. RA_CNTR is a counter for the calculation of the running average, having an initial value of zero. P0 is the P0 value (dB) given by the network. PRE_AGC_UPDT_CNTR is a counter indicating how many blocks ago the preceding value AGC_REF_RXLEV was updated. A temporary variable a is used to transmit the forgetting factor for the calculation of the running average.

In the following, the pseudo code of the algorithm will be presented, to illustrate the details and operating principles of the invention. The algorithm is always performed once at the end of a block period, after the received blocks have been decoded. It should be noted that the pseudo codes presented in the description are combined, if necessary, to form an entity and, if necessary, it is supplemented with a pseudo code to implement other operations according to the description. In the IF block, it is first examined, if reference blocks for the AGC were received during the preceding block period (TRUE).

```
IF TRUE;
    RA_CNTR = MIN(RA_CNTR + 1,
                                AGC_REF_RXLEV_FILT_LEN_A);
    a = 1/RA_CNTR;
    AGC_REF_RXLEV = a × BLOCKS_RXLEV_A + (1 − a) ×
                                AGC_REF_RXLEV;
    PRE_AGC_UPDT_CNTR = 0;
ELSE;
    PRE_AGC_UPDT_CNTR = PRE_AGC_UPDT_CNTR + 1;
    IF (RA_CNTR > AGC_REF_RXLEV_FILT_LEN /
                                PRE_AGC_UPDT_CNTR);
        RA_CNTR = RA_CNTR − 1;
    ENDIF;
    IF (RA_CNTR > AGC_REF_RXLEV_FILT_LEN/2);
        RA_CNTR = RA_CNTR − 2;
    ENDIF;
    IF (PRE_AGC_UPDT_CNTR = AGC_UPDATE_INTERVAL);
        AGC_REF_RXLEV = (X × (BCCH_RA_n −
                                P0) + Y × AGC_REF_RXLEV)/(X + Y);
        PRE_AGC_UPDT_CNTR = 0;
    ENDIF;
ENDIF;
```

We shall next discuss the tracing of the Rx level in the power control of Mode B, wherein the MS is first set to wait for an RLC block which is addressed to it and whose Rx level corresponds to the level BCCH-P0 used for the transmission, i.e., according to the formula AGC_REF_RXLEV=BCCH_RA_n-P0. After this, AGC_REF_RXLEV is calculated as a running average from the RLC reference blocks, by using a filter with a variable length in the calculation of the running average. In the PR Mode B, all the blocks having a PR field are valid. In the PR Mode A, only the blocks which have a PR field and which are addressed to the MS in question, are valid. Similarly to Mode A (PR Mode B), other blocks than own blocks are available for calculating and describing the running average. The difference between the calculated and the real Rx levels can be, at its worst, 6 dB, and the compensation is thus less accurate than in Mode A. Another difference to Mode A is that if the MS does not receive the reference block during the predetermined 78 TDMA frames, the ARR parameter is updated by using the change that took place in the value BCCH_RA and after the last received reference block.

The following is a more detailed description of the algorithm of Mode B.

The gain is calculated for the next beginning block period after AGC_REF_RXLEV has been updated by using the algorithm. All the correctly received blocks which are addressed to the MS and which have a valid PR field can be used as reference blocks for the AGC. Before the beginning of the PDTCH configuration, the value AGC_REF_RXLEV is set to the value BCCH_RA_n-P0.

The constant REF_RXLEV_FILT_LEN_B used in the algorithm is the filter length for filtering the running average (i.e. the inverse value of the forgetting factor) and for calculating it in Mode B. The variable BLOCKS_RX-LEVS_B used in the algorithm is the measured average of the Rx level of the reference blocks in the preceding block period, in units of dBm, wherein the blocks which are not addressed to the MS are compensated for by using the PR value, if the PR value differs from its own PR value which was used last. Thus, the compensated Rx level (dBm) is obtained by reducing from the PR value the last own PR value, by multiplying the result with the constant 8 (dB), and by adding the result to the Rx level. The constant 8 is obtained from the difference between two successive PR values of the Rx level. The principle is that compensation is not performed for own blocks and for those foreign blocks which have the same PR value as in the latest own block. The compensation is only performed for foreign blocks having a different PR value. The use of foreign blocks as a reference is only applied in PR Mode B. The tracing of the ARR value is described to correspond to the own transmission which is performed on some level BCCH-X. In PR Mode B, all the blocks with a PR field are suitable for use as references. In PR Mode A, only the blocks addressed to the MS (and containing a PR field) are valid.

In the following, the pseudo code of the algorithm will be presented, to illustrate the details of the invention. In the IF block, it is first examined, if reference blocks for the AGC were received during the preceding block period (TRUE).

```
IF TRUE;
    RA_CNTR = MIN(RA_CNTR + 1,
                            AGC_REF_RXLEV_FILT_LEN_B);
    a = 1/RA_CNTR;
    AGC_REF_RXLEV = a × BLOCKS_RXLEV_B + (1 - a) ×
                                            AGC_REF_RXLEV;
    PRE_AGC_UPDT CNTR = 0;
    LAST_AGC_REF_LEVEL = AGC_REF_LEVEL;
    LAST_BCCH_RA = BCCH_RA_n
ELSE;
    PRE_AGC_UPDT_CNTR = PRE_AGC_UPDT_CNTR + 1;
    IF (RA_CNTR > AGC_REF_RXLEV_FILT_LEN/
                            PRE_AGC_UPDT_CNTR);
        RA_CNTR=RA_CNTR - 1;
    ENDIF;
    IF (RA_CNTR > AGC_REF_RXLEV_FILT_LEN/2);
        RA_CNTR=RA_CNTR -2;
```

-continued

```
    ENDIF;
    IF (PRE_AGC_UPDT_CNTR = AGC_UPDATE_INTERVAL);
        PRE_AGC_UPDT_CNTR = 0;
        AGC_REF_RXLEV = LAST_AGC_REF_RXLEV -
                            LAST_BCCH_RA + BCCH_RA_n;
    ENDIF;
ENDIF;
```

We shall next discuss a situation in which the BTS does not use power control in D communication, that is, Mode A or Mode B is not in use.

The BTS will thus transmit at a constant power level BCCH-X, in which X is normally the Pb value, but it may also differ from this. Thus, before the beginning of the PDTCH configuration, the value AGC_REF_RXLEV is set to the value BCCH_RA_n-Pb. The ARR parameter is calculated by using a running average and a filter with a variable length, as in Modes A and B. If the MS does not receive reference blocks during a period comprising 78 TDMA frames, AGC_REF_RXLEV is updated by using the maximum Rx level of an incorrect block, which is thus a sample for calculating the average.

In the algorithm according to the invention, the reference Rx level intended for the AGC is traced in the PDTCH configuration, that is, when the MS is in the GPRS transfer state. The gain is calculated for the next beginning block sequence, after AGC_REF_RXLEV has first been updated by using an algorithm. All correctly received blocks can be used as reference blocks.

The constant REF_RXLEV_FILT_LEN_C used in the algorithm is the filter length for filtering the running average. VERY_SMALL_RXLEV is a very small Rx level, for example -120 dBm. The variable BLOCKS_RXLEVS[] is a table of the Rx levels (in units of dBm) of the blocks received at different allocated time periods (max 8), irrespective of the fact whether the block was correctly received. The parameter BLOCKS_RXLEVS_C is the average from the Rx levels of the blocks (reference blocks) of the table which were encoded correctly. The parameter ERR_BLOCKS_MAX_RXLEV is the maximum average of the Rx level for the blocks which were encoded incorrectly. At the beginning of the PDCH, this value is set to VERY_SMALL_RXLEV.

In the following, the pseudo code of the algorithm will be presented, to illustrate the details of the invention. In the IF block, it is first examined, if reference blocks for the AGC were received during the preceding block period (TRUE).

```
IF TRUE;
    RA_CNTR = MIN (RA_CNTR + 1,
                            AGC_REF_RXLEV_FILT_LEN_C);
    a = 1/RA_CNTR;
    AGC_REF_RXLEV = a × BLOCKS_RXLEV_C + (1 - a) ×
                                            AGC_REF_RXLEV;
    PRE_AGC_UPDT_CNTR= 0;
    MAX_ERR_BLOCKS_RXLEV = VERY_SMALL_RXLEV;
ELSE;
    PRE_AGC_UPDT_CNTR = PRE_AGC_UPDT_CNTR + 1;
    IF (RA_CNTR > AGC_REF_RXLEV_FILT_LEN/
                            PRE_AGC_UPDT_CNTR);
        RA_CNTR = RA_CNTR - 1;
    ENDIF
    IF (RA_CNTR > AGC_REF_RXLEV_FILT_LEN/2)
        RA_CNTR = RA_CNTR - 2;
```

-continued

```
    ENDIF;
    IF (ERR_BLOCKS_MAX_RXLEV < MAX(BLOCKS_RXLEVS[]));
        ERR_BLOCKS_MAX_RXLEV = MAX(BLOCKS_RXLEVS[]);
    ENDIF
    IF (PRE_AGC_UPDT_CNTR = AGC_UPDATE_INTERVAL)
        RA_CNTR = MIN (RA_CNTR + 1,
                                        AGC_REF_RXLEV_FILT_LEN_C);
        a = 1/RA_CNTR;
        AGC_REF_RXLEV = a ×
        MAX_ERR_BLOCKS_RXLEV + (1 −a) ×
                                        AGC_REF_RXLEV;
        PRE_AGC_UPDT_CNTR = 0;
        MAX_ERR_BLOCKS_RXLEV = VERY_SMALL_RXLEV;
    ENDIF
ENDIF
```

We shall next discuss clipping control, which is necessary to be able to react to very fast changes in the Rx level in Modes A and B. If the properties of the radio channel change very randomly so that very fast changes take place in the Rx level, the tracing of the running reference Rx level will not be sufficient. The control will first determine a lower limit and an upper limit for the receiving window of the gained and AD converted signal of the MS, between which the Rx levels of the received bursts should be when they belong to valid blocks. Clipping will take place, if the signal level of a single burst exceeds the upper limit, and inverse clipping will take place, if the average of the Rx levels of the two preceding bursts is below the lower limit. After the clipping, the gain is immediately corrected to the right level, to receive other bursts of the block. By this method, the gain can be adapted once or several times but normally only once during a block period. After the block (or blocks) has been received and decoded, it is checked if the burst (or bursts) is valid for clipping control, that is, if the burst which caused the clipping belongs to a block which is a block valid as a reference according to the power control modes. If the clipped block is valid, the ARR parameter is updated according to the principles to be described in the following.

In the following, the pseudo code of the clipping algorithm will be presented. The algorithm is performed before the algorithms described above, or at the beginning of the first IF unit. In the IF block, it is first examined, if cutting has taken place (TRUE). In Mode A, and when power control is not in use, it is possible to use all blocks for the clipping control, including blocks which have been received incorrectly, but in Mode B, addressed blocks only. In the inverse clipping algorithm, it is only possible to use AGC reference blocks which are valid according to the power control modes (including also the alternative with no power control). The ARR is always corrected after clipping or inverse clipping, for a block valid for clipping control. The value of the constant CLIP_CORRECTION_UP or CLIP_CORRECTION_DOWN (in dB) also tells how much the ARR value is corrected when clipping up or down takes place.

```
    IF TRUE;
        AGC_REF_RXLEV = AGC_REF_RXLEV +
                                        CLIP_CORRECTION_UP;
    ENDIF;
```

In case of inverse clipping, the pseudo code is presented as follows. The algorithm is performed before the algorithms described above, or at the beginning of the first IF unit. In the IF block, it is first examined, if cutting has taken place (TRUE).

```
    IF TRUE;
        AGC_REF_RXLEV = AGC_REF_RXLEV −
                                        CLIP_CORRECTION_DOWN;
    ENDIF;
```

In the GPRS system, the allocation of channels is very flexible; for example, 1 to 2 time slots of a channel, or 1 to 8 logical channels, can be allocated to each wireless communication device MS within the scope of a TDMA frame. Thus, in the so-called multislot configuration, and irrespective of the power control mode, the gain is set the same for each allocated time slot and, at the beginning of the block, the required gain is calculated from the ARR parameter. In case of clipping, the gains for different time slots may thus differ from each other during the rest of the block period. Before the beginning of the next block, the gain is determined again from the ARR value and is set the same for each time slot.

The present invention is not limited solely to the above-presented embodiments, but it can be modified within the scope of the appended claims.

The invention claimed is:

1. A method in a receiver for determining a reference level for automatic gain control of the receiver for a radio frequency signal to be received, the signal having a varying signal strength, said method comprising:
   receiving radio blocks in said receiver on a logical packet data traffic channel of the signal, which radio blocks have been transmitted with a predetermined transmission power and by using a predetermined way of controlling the transmission power,
   determining continuously said reference level on the basis of correctly received valid radio blocks of the logical packet data traffic channel, and
   correcting said reference level on the basis of the signal strength measured during the reception of each valid radio block.

2. A method according to claim 1, comprising:
   correcting the reference level by calculating a running average of the reference level with respect to time.

3. A method according to claim 2, comprising:
   calculating the running average by using filtering with a variable length, wherein a period, during which the running average is calculated, is substantially constant, depending on the frequency of occurrence of the valid radio blocks.

4. A method according to claim 3, comprising: calculating, by using the running average, a predetermined number of the valid radio blocks as a forgetting factor.

5. A method according to claim 2, comprising:
calculating, by using the running average, a predetermined number of the valid radio blocks as a forgetting factor.

6. A method according to claim 1, comprising:
receiving a signal of a broadcasting channel, which signal of the broadcasting channel has been transmitted at a predetermined constant transmission power, and
correcting the reference level on the basis of a signal strength of the broadcasting channel measured during the reception of the signal of the broadcasting channel, if the valid radio block has not been received during a predetermined period of time.

7. A method according to claim 6, comprising:
calculating a running average of the signal strength of the broadcasting channel with respect to time.

8. A method according to claim 7, comprising:
calculating filtering with a variable length by using the running average of the signal strength of the broadcasting channel.

9. A method according to claim 6, wherein said broadcasting channel is the BCCH channel of the GPRS network.

10. A method according to claim 6, comprising:
determining the signal strength of the broadcasting channel by using samples taken from the signal of the broadcasting channel.

11. A method according to claim 6, wherein said predetermined period of time is a period comprising 18 successive radio blocks in the GPRS network.

12. A method according to claim 6, comprising:
compensating, on the basis of a transmission power information contained in the valid radio block, the measured signal strength of the radio block to a predetermined level which is proportional to the signal strength of the broadcasting channel, when the transmission power of the radio blocks vary.

13. A method according to claim 6, comprising:
selecting, for the determination, such valid radio blocks which are received at intervals of a predetermined period, for synchronization of the receiver and a communication network.

14. A method according to claim 1, comprising:
selecting, for the determination, such valid radio blocks which are received at intervals of a predetermined period, for synchronization of the receiver and a communication network.

15. A method according to claim 14, wherein said predetermined period of time is a period comprising 18 successive radio blocks in the GPRS network.

16. A method according to claim 14, comprising:
compensating, on the basis of a transmission power information contained in the valid radio block, the measured signal strength of the radio block to a predetermined level which is proportional to the signal strength of the broadcasting channel, when the transmission power of the radio blocks vary.

17. A method according to claim 14, comprising:
interpreting address information and transmission power information contained in the valid radio block to determine a recipient of the radio block and the transmission power use, respectively.

18. A method according to claim 1, comprising:
interpreting information and transmission power information contained in the valid radio block to determine a recipient of the radio block and the transmission power used, respectively.

19. A method according to claim 18, comprising:
selecting, for the determination, such valid radio blocks which are addressed to a specific recipient and which contain transmission power information, when the transmission power varies between recipients and the transmission power of the radio blocks vary.

20. A method according to claim 18, comprising:
selecting, for the determination, such valid radio blocks which are addressed to different recipients and which contain transmission power information, when the transmission power remains the same among recipients and the transmission power of the radio blocks vary.

21. A method according to claim 1, comprising:
selecting, for the determination, such valid radio blocks which are addressed to different recipients, when the transmission powers remains the same among recipients and the transmission power of the radio blocks remain constant.

22. A method according to claim 1, comprising:
correcting the reference level on the basis of the maximum signal strength measured from incorrectly received radio blocks, if, within a predetermined period of time, no valid radio blocks have been received during the maximum interval of occurrence of reference blocks.

23. A method according to claim 1, comprising:
correcting the reference level by a predetermined value, when clipping has occurred in the reception of the valid radio block when the signal strength is below a set minimum limit or above a set maximum limit.

24. A method according to claim 1, comprising:
receiving radio blocks on two or more logical packet data traffic channels, which radio blocks have been transmitted at a predetermined transmission power and by using a predetermined method of transmission power control, and
determining continuously said reference level on the basis of valid radio blocks and for each of said logical packet data traffic channels.

25. A method according to claim 1, comprising:
using a wireless communication unit to receive the valid radio blocks transmitted by a base transceiver station of a packet switched communication network based on a cellular system.

26. A method according to claim 25, comprising:
measuring the signal strength of an analog signal received in said wireless communication unit, and
correcting the signal gain on the basis of the determined reference level.

27. A method according to claim 1, wherein said logical packet data traffic channel is the PDTCH, D channel of the GPRS network.

28. A method according to claim 1, wherein said predetermined way is constant power control used by the GPRS network in downlink data transmission, power control according to mode A, which has a limited variation in output power, or power control according to mode B, which has a whole range variation in output power.

29. A device in a receiver for determining a reference level for automatic gain control of the receiver for a radio frequency signal to be received, the signal having a varying signal strength, said device comprising:

a circuit for receiving in said receiver, on a logical packet data traffic channel of the signal, radio blocks which have been transmitted with a predetermined transmission power and by using a predetermined way of controlling the transmission power, a circuit for continuous determination of said reference level on the basis of correctly received valid radio blocks of the logical packet data traffic channel, wherein said circuit configured to correct said reference level on the basis of the signal strength measured during the reception of each valid radio block.

30. A device according to claim 29, wherein the device further comprises:

a circuit for receiving a signal of a broadcasting channel, which signal of the broadcasting channel has been transmitted at a predetermined constant transmission power, and wherein said circuit further configured to correct the reference level on the basis of a signal strength of the broadcasting channel measured during the reception of the signal of the broadcasting channel, if the valid radio block has not been received during a predetermined period of time.

31. A device according to claim 30, wherein the device further comprises:

a circuit for measuring the signal strength of a received analog signal, and wherein said circuit is further configured to correct the signal gain on the basis of the determined reference level at predetermined intervals.

32. A device according to claim 29, wherein the device further comprises:

a circuit for measuring the signal strength of a received analog signal, wherein said circuit further configured to correct the signal gain on the basis of the determined reference level at predetermined intervals.

33. A device according to claim 29, wherein said device is a wireless communication unit operating in the GPRS network.

34. A method for determining a reference level for automatic gain control of a radio frequency signal to be received, the signal having a varying signal strength, said method comprising:

receiving radio blocks on a logical packet data traffic channel of the signal, which radio blocks have been transmitted with a predetermined transmission power and by using a predetermined way of controlling the transmission power, determining continuously said reference level on the basis of correctly received valid radio blocks of the logical packet data traffic channel, and correcting said reference level on the basis of the signal strength measured during the reception of each valid radio block;

receiving a signal of a broadcasting channel which signal of the broadcasting channel has been transmitted at a predetermined constant transmission power, and correcting the reference level on the basis of a signal strength of the broadcasting channel measured during the reception of the signal of the broadcasting channel, if the valid radio block has not been received during a predetermined period of time, wherein said predetermined period of time is a period comprising 18 successive radio blocks in the GPRS network.

35. A method for determining a reference level for automatic gain control of a radio frequency signal to be received, the signal having a varying signal strength, said method comprising:

receiving radio blocks on a logical packet data traffic channel of the signal, which radio blocks have been transmitted with a predetermined transmission power and by using a predetermined way of controlling the transmission power, determining continuously said reference level on the basis of correctly received valid radio blocks of the logical packet data traffic channel, correcting said reference level on the basis of the signal strength measured during the reception of each valid radio block; and correcting the reference level on the basis of the maximum signal strength measured from incorrectly received radio blocks, if, within a predetermined period of time, no valid radio blocks have been received during the maximum interval of occurrence of reference blocks.

36. A method for determining a reference level for automatic gain control of a radio frequency signal to be received, the signal having a varying signal strength, said method comprising:

receiving radio blocks on a logical packet data traffic channel of the signal, which radio blocks have been transmitted with a predetermined transmission power and by using a predetermined way of controlling the transmission power, determining continuously said reference level on the basis of correctly received valid radio blocks of the logical packet data traffic channel, correcting said reference level on the basis of the signal strength measured during the reception of each valid radio block; and correcting the reference level by a predetermined value, when clipping has occurred in the reception of the valid radio block when the signal strength is below a set maximum limit or above a set maximum limit.

37. A method for determining a reference level for automatic gain control of a radio frequency signal to be received, the signal having a varying signal strength, said method comprising:

receiving radio blocks on a logical packet data traffic channel of the signal, which radio blocks have been transmitted with a predetermined transmission power and by using a predetermined way of controlling the transmission power, determining continuously said reference level on the basis of correctly received valid radio blocks of the logical packet data traffic channel, correcting said reference level on the basis of the signal strength measured during the reception of each valid radio block;

receiving radio blocks on two or more logical packet data traffic channels, which radio blocks have been transmitted at a predetermined transmission power and by using a predetermined method of transmission power control, and determining continuously said reference level on the basis of valid radio blocks and for each of said logical packet data traffic channels.

38. A method for determining a reference level for automatic gain control of a radio frequency signal to be received, the signal having a varying signal strength, said method comprising:

receiving radio blocks on a logical packet data traffic channel of the signal, which radio blocks have been transmitted with a predetermined transmission power and by using a predetermined way of controlling the transmission power, determining continuously said reference level on the basis of correctly received valid radio blocks of the logical packet data traffic channel, correcting said reference level on the basis of the signal strength measured during the reception of each valid radio block; and selecting, for the determination, such valid radio blocks which are received at intervals of a predetermined period, for synchronization of the receiver and a communication network, wherein said predetermined period of time is a period comprising 18 successive radio blocks in the GPRS network.

* * * * *